United States Patent
Wojnarowski et al.

(10) Patent No.: US 6,272,271 B1
(45) Date of Patent: Aug. 7, 2001

(54) ALIGNMENT OF OPTICAL INTERFACES FOR DATA COMMUNICATION

(75) Inventors: Robert John Wojnarowski, Ballston Lake; Glenn Alan Forman, Niskayuna; Yung Sheng Liu, Schenectady, all of NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/301,910

(22) Filed: Apr. 29, 1999

(51) Int. Cl.[7] ....................................................... G02B 6/26
(52) U.S. Cl. ............................ 385/52; 359/163; 359/110; 250/221; 250/553
(58) Field of Search ........................ 385/52, 97; 250/221, 250/222.1, 551, 229, 553; 359/159, 110, 163

(56) References Cited

U.S. PATENT DOCUMENTS

| | | |
|---|---|---|
| 4,714,516 | 12/1987 | Eichelberger et al. . |
| 4,764,485 | 8/1988 | Loughran et al. . |
| 4,780,177 | 10/1988 | Wojnarowski et al. . |
| 4,783,695 | 11/1988 | Eichelberger et al. . |
| 4,835,704 | 5/1989 | Eichelberger et al. . |
| 4,842,677 | 6/1989 | Wojnarowski et al. . |
| 4,894,115 | 1/1990 | Eichelberger et al. . |
| 4,933,042 | 6/1990 | Eichelberger et al. . |
| 5,019,946 | 5/1991 | Eichelberger et al. . |
| 5,157,255 | 10/1992 | Kornrumpf et al. . |
| 5,169,678 | 12/1992 | Cole et al. . |
| 5,302,547 | 4/1994 | Wojnarowski et al. . |
| 5,353,498 | 10/1994 | Fillion et al. . |
| 5,452,182 | 9/1995 | Eichelberger et al. . |
| 5,525,190 | 6/1996 | Wojnarowski et al. . |
| 5,562,838 | 10/1996 | Wojnarowski et al. . |
| 5,737,458 | 4/1998 | Wojnarowski et al. . |

OTHER PUBLICATIONS

U.S. Patent Application No. 09/258,935, Filed Mar. 1, 1999, Attorney Docket No. RD–26,485, by R. J. Wojnarowski, et al., Entitled Light Source Including an Array of Light Emitting Semiconductor Devices and Control Method.

*Primary Examiner*—Darren Schuberg
*Assistant Examiner*—Fayez Assaf (57) ABSTRACT

An optical interface for data communication that can be manufactured and aligned in a cost effective manner includes an array of optical emitters and an optical receiver are positioned within a predetermined tolerance with reference to each other so as to establish an optical data communication path. To search for and determine which of the emitters of the array achieves the best alignment, the optical emitters are individually energized in a sequence, while monitoring the output signal of the optical receiver. For subsequent data communications, the optical emitter determined to achieve the best alignment is employed.

18 Claims, 9 Drawing Sheets

ALIGNMENT OF OPTICAL INTERFACES FOR DATA COMMUNICATION

This invention was made with Government support under contract number F33615-94-C-1531 awarded by DARPA. The Government has certain rights in the invention.

BACKGROUND OF THE INVENTION

This invention relates generally to optical interfaces for data communication and, more particularly, to optical interfaces which can be manufactured and aligned in a cost-effective manner, as well as to methods for aligning such optical interfaces.

Optical data communications technology has a number of advantages over wire technology. For example, bandwidth, data rate and response characteristics are superior to those of conventional wire technology. Optical technology is essentially immune to RFI (radio frequency interference) and EMI (electromagnetic interference) issues that plague wire technology. Shielding as in coaxial cables is not required, allowing the overall size and weight of systems to shrink.

Optical fiber telephone lines and world wide data links are replacing the bandwidth-limited wire technology. Likewise, optical technology, particularly optical interfaces for data communications, is highly desired in a variety of applications such as multi-component modules (MCMs), various printed circuit board (PCB) technologies, and integrated backplanes. Employing optical timing in radar transmit/receive modules to form phased array antennas is an objective in design of radar installations.

In such systems, electro-optical devices can be employed at the point of conversion from light to electronic transmission, and vice-versa. (As employed herein the term "light" is not limited to visible light, and includes optical wavelengths both above and below the range of visible light wavelengths). Electro-optical devices typically comprise semiconductor devices, which may be referred to as "chips" or "die." Examples of optical emitters or transmitters include light emitting diodes (LEDs), laser diodes, and arrays of these used in automobile tail light applications. An example of an optical receiver is a photodiode. The integration of such electro-optical devices within high density interconnect structures, including the use of adaptive lithography techniques to produce optical interconnects, is disclosed in aforementioned Wojnarowski et al., U.S. Pat. Nos. 5,562,838 and 5,737,458.

Problems associated with micro-optical alignment prevent the economical usage of optical technology. Generally, micro-optical alignment is an expensive hand tuning operation. Thus, what is limiting a great number of potential applications is the ability to correctly align an optical die to an optical path, such as is represented by an optical fiber or by a corresponding optical die, as well as the ability to interconnect an optical assembly to a backplane.

BRIEF SUMMARY OF THE INVENTION

In an exemplary embodiment of the invention, an array of optical emitters, such as laser diodes or light emitting diodes (LEDs), for example, and an optical receiver or an end of an optical fiber are positioned within a predetermined tolerance with reference to each other so as to establish an optical data communication path. One of the optical emitters provides the most optimum path. To search for and determine which emitter in the array of optical emitters provides the optimum optical path, that is, achieves the best alignment, the optical emitters are individually energized in a sequence, while monitoring an output signal of the optical receiver or of the optical fiber. Thus, the laser diode array, with redundant laser emitting cells, is energized in a scanning manner, while the receiver output signal is monitored for the best fit signal response. This may be done individually in a sequential manner, or may be done automatically as various subassemblies are assembled into a system, and additionally upon each repair or replacement operation. The scanning and monitoring may be performed by a setup align algorithm for post-assembly. For subsequent data communications, the optical emitter determined to achieve the best alignment is employed.

Conversely, in another exemplary embodiment of the invention, an array of optical receivers and an optical emitter are mechanically positioned within a predetermined tolerance with reference to each other to establish an optical data communication path. One of the optical receivers corresponds to the most optimum optical path from the optical emitter. To determine which receiver in the array of optical receivers corresponds to the most optimum optical path, in other words, which achieves the best alignment, the optical emitter is energized, and output signals of the optical receivers are measured. For subsequent data communications, the optical receiver determined to achieve the best alignment is employed.

The invention accordingly provides optical-to-electronic interfaces in a cost effective manner, and facilitates automating the alignment process between optical fibers, optical electronic assemblies, and optical connector interfaces to associated assemblies such as backplanes. The invention may be deployed in PC card and backplane assemblies, in combination with a variety of three-dimensional stacking technologies, and in a variety of other applications where critical alignment of optical subassemblies is important. The invention may also be employed to find related ends of long multi-fiber optical cables, such as under rivers and oceans. Labor intensive alignment operations are minimized in a manner suitable for production applications.

DETAILED DESCRIPTION OF THE INVENTION

Figure 1:
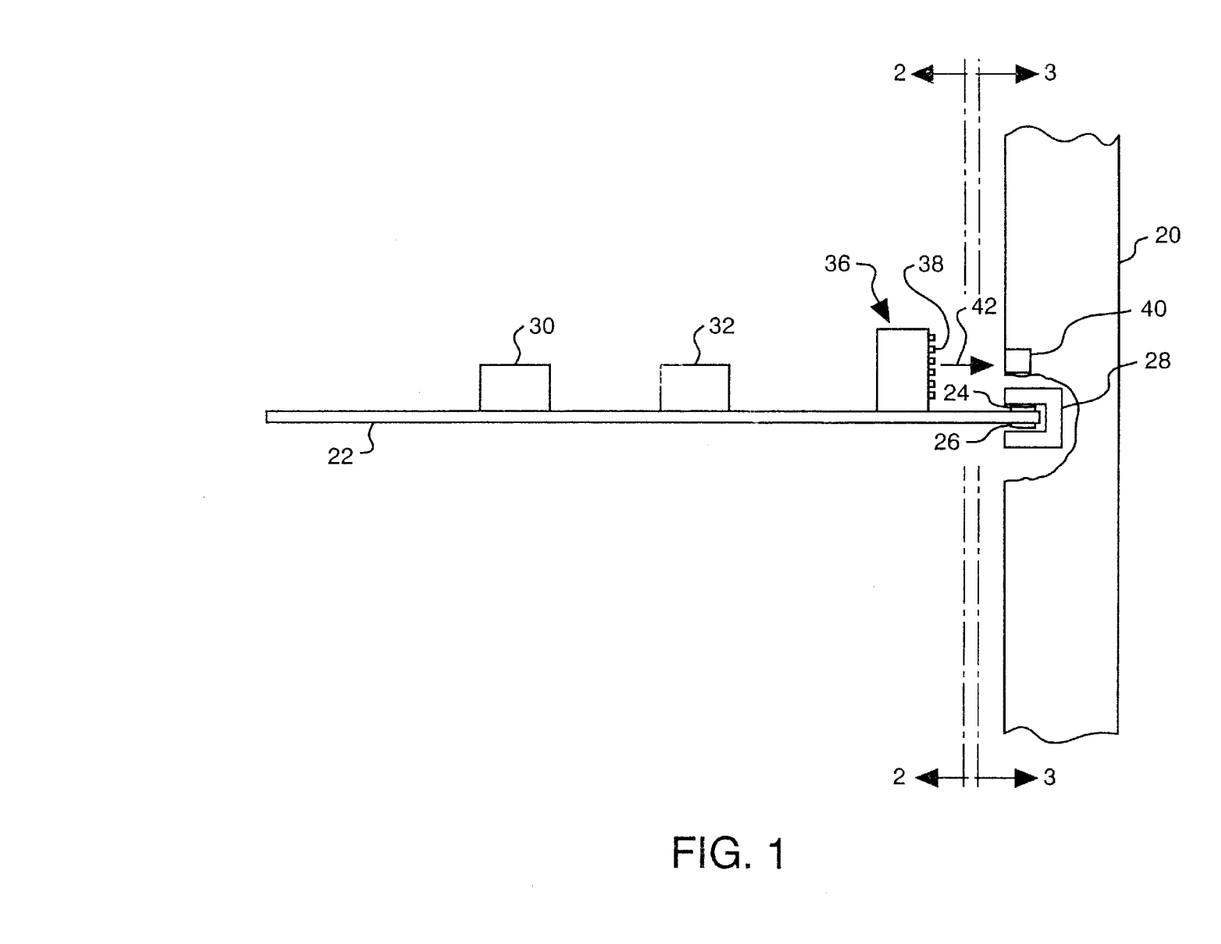
FIG. 1 is a side elevational view depicting a printed circuit board plugged into and optically coupled to a backplane array, with a portion of the backplane array cut away.
Figure 2:
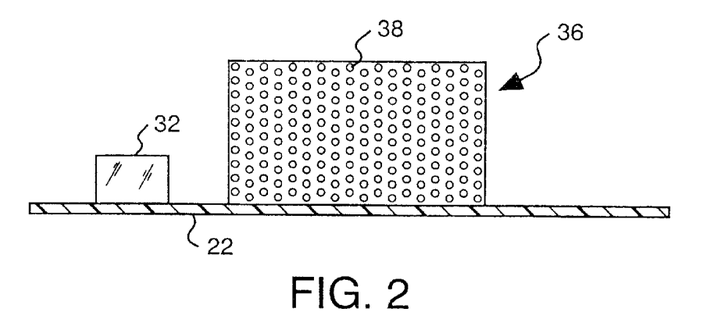
FIG. 2 is cross-sectional view taken on line 2—2 of FIG. 1.
Figure 3:
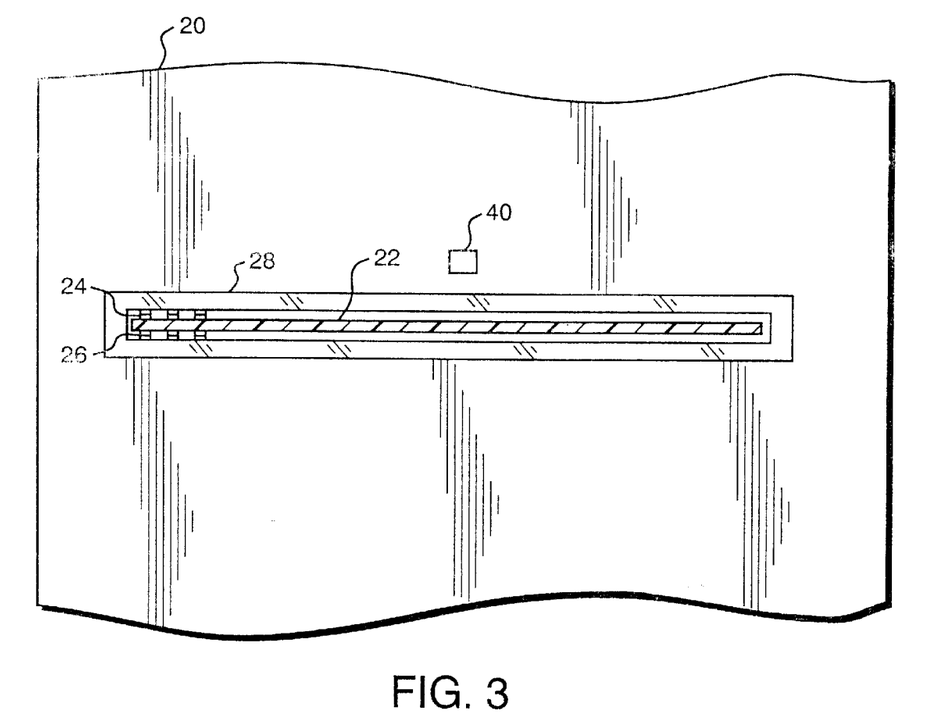
FIG. 3 is a cross-sectional view taken on line 3—3 of FIG. 1.

Referring now to FIGS. 1, 2 and 3, schematically illustrated is a portion of a backplane array or card rack 20 receiving a plurality of printed circuit boards (PCBs), such as representative printed circuit board 22. For electrical connections such as power and ground, printed circuit board 22 includes finger-like electrical contacts 24 and 26 that mate with corresponding contacts of a card edge connector 28, which physically is a part of backplane array 20. Representative components mounted to printed circuit board 22 are designated 30 and 32. Conventional structural support elements are omitted for clarity of illustration. Thus, backplane array 20 is a conventional card rack that has side shelf fixturing (not shown) for mechanical mounting and to align the printed circuit board 22 for proper alignment of the finger-like electrical contacts 24 and 26 with contacts of card edge connector 28.

For optical data communications, not subject to bandwidth, data rate and response characteristics of the card edge connector 28 and associated finger-like contacts 24 and, 26, a two-dimensional array 36 of optical emitters 38, such as LEDs or laser diodes, is mounted to printed circuit board 22, and positioned within a predetermined tolerance with reference to an optical receiver 40, such as a photodiode or other type of photodetector, for example, mounted to backplane array 20, so as to establish an optical data communication path. Array 36 is large enough to accommodate misalignment of array 36 with reference to optical receiver 40 within the predetermined tolerance. Arrow 42 represents a beam of light directed from one of the optical emitters 38 to optical receiver 40. A lens (not shown) may be employed to focus the light.

Optical emitters 38 comprising array 36 are packaged in any suitable manner. The packaging pitch of optical emitters 38 determines a minimum tolerance. LEDs and multiplexing circuitry may be included on the same wafer scale integration (WSI) chip. In one embodiment, array 36 comprises an application specific integrated circuit (ASIC) chip including the optical emitters. The embodiment permits a tight packaging pitch and provides a good tolerance for alignment with the optical receiver.

High density interconnect (HDI) fabrication techniques, as are disclosed in Eichelberger et al., U.S. Pat. No. 4,783, 695 and in commonly assigned Wojnarowski et al., U.S. application Ser. No. 09/258,935, filed Mar. 1, 1999, entitled "Light Source Including an Array of Light Emitting Semiconductor Devices and Control Method," can be used instead of or in addition to an ASIC chip. This results in tighter packaging compared to the use of wire bonding. A micro PCB with wire bonds can also be used.

For alignment purposes, optical emitters 38 are individually energized in a sequence, while the output signal of optical receiver 40 is monitored, to determine which emitter 38 in the array 36 of emitters achieves the best optical alignment, which may be referred to as the most optimum available optical path. Thereafter, for subsequent data communications, the particular one of the optical emitters 38 determined to achieve the best alignment is employed.

Figure 4:
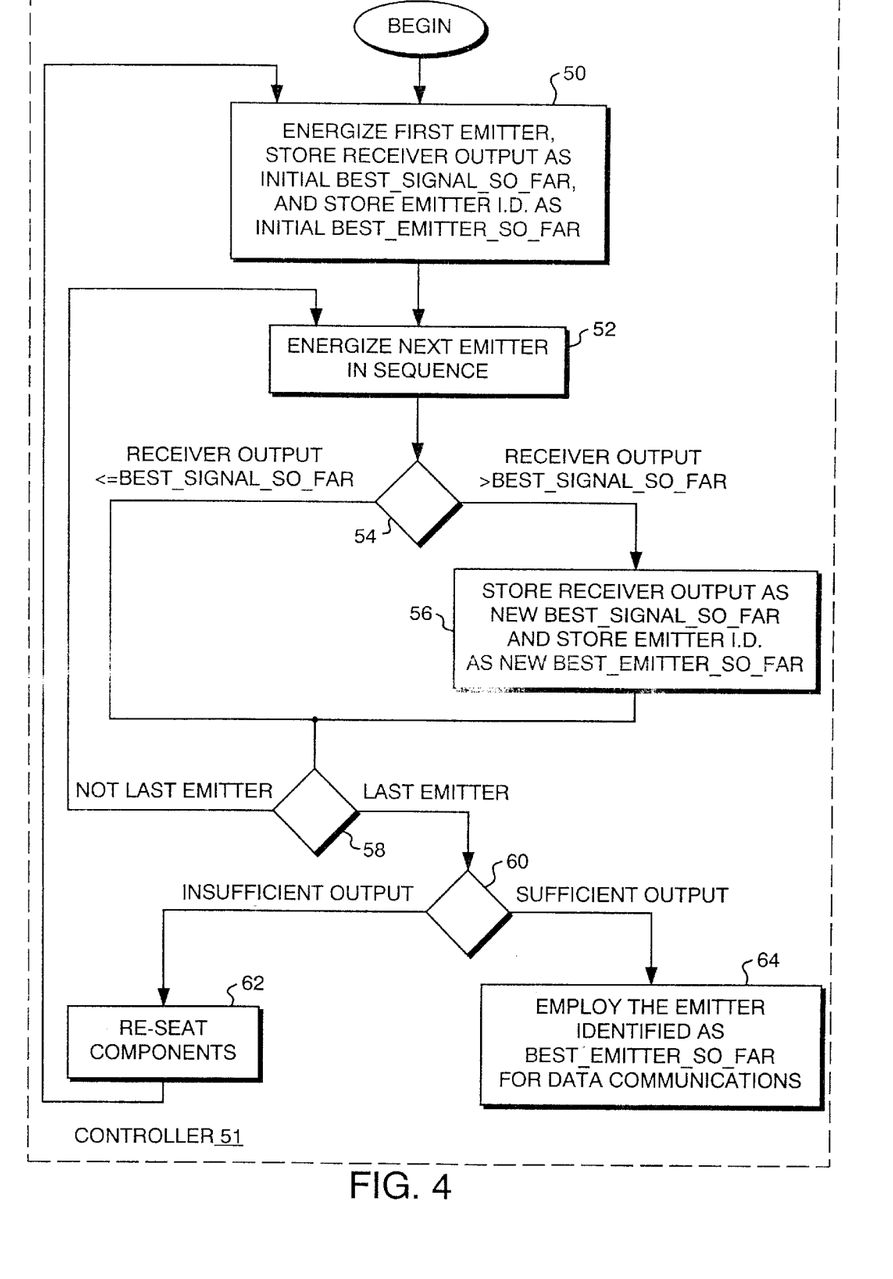
FIG. 4 is a flow chart depicting a method embodying the invention.

A typical alignment process embodying the invention is represented in the flow chart of FIG. 4 which in one embodiment may be embodied in a controller 51 comprising a computer or microprocessor, for example. During the alignment process individual emitters 38 of array 36 are addressed in any conventional manner, typically by multiplexing. Thus, in box 50 a first one of the emitters 38 is energized. The resultant output signal (if any) of receiver 40 is stored to initialize a variable BEST_SIGNAL_SO_FAR, and an identification of the particular emitter 38 is stored to initialize another variable BEST_EMITTER_SO_FAR.

A loop is then entered, beginning with box 52, wherein the next emitter 38 in a sequence is energized. In decision box 54, the output signal (if any) of receiver 40 is compared with the value of the stored variable BEST_SIGNAL_SO_FAR. If the receiver output signal is greater than the value of the stored variable BEST_SIGNAL_SO_FAR, then in box 56 the receiver 40 output signal is stored as the new value of the variable BEST_SIGNAL_SO_FAR, and the identification of the particular one of the emitters 38 is stored as the new value of the variable BEST_EMITTER_SO_FAR. Execution then proceeds to decision box 58. If, on the other hand, in decision box 54 the receiver 40 output signal is less than or equal to the value of the variable BEST_SIGNAL_SO_FAR, then execution proceeds directly to decision box 58.

Decision box 58 determines whether the scanning process is completed. If the last emitter 38 in the sequence has not been energized, then execution loops back to box 52. If the last emitter 38 has been energized, then decision box 60 next determines whether a suitable optical alignment or "fit" has been achieved. Thus if in decision box 60 it is determined that the magnitude of the receiver 40 output signal stored as the value of the variable BEST_SIGNAL_SO_FAR is insufficient, indicating that satisfactory alignment has not been achieved, then in box 62 relevant components (e.g. printed circuit board 22) are reseated, and the process begins again with box 50. If in decision box 60 it is determined that satisfactory alignment has been achieved, then execution proceeds to box 64, where in the particular emitter 38 which achieved the best alignment as identified in the variable BEST_EMITTER_SO_FAR is employed for subsequent data communications.

The alignment process represented in FIG. 4 may be done manually by a technician, or may be accomplished as an electronically-directed automatic alignment process, either on a full time basis, or for a one-time-then-stop alignment. Alignment is typically performed during initial assembly of a system, as well as upon each repair or replacement operation, such as when card 22 is removed and then replaced.

Moreover, in environments that are particularly prone to alignment degradation, such as where vibration or dirt is present, the automatic alignment process may be performed periodically. The automatic periodic alignment may be a dynamic process which in effect optimizes the optical path on an essentially continuous basis. Duty cycles are such that multiplexing can be employed to transmit data between emitter energizing pulses which are for alignment purposes. Such is particularly advantageous where vibration or other environmental factors are present.

Although array 36 of optical emitters 38 is shown mounted to printed circuit board 22 and optical receiver 40 is shown mounted to backplane 20 for optical data transmission from printed circuit board 22 to backplane 20, the relative positions of emitter array 36 and receiver 40 may be reversed for optical data transmission from backplane 20 to printed circuit board 22, with receiver 40 in that case being mounted on printed circuit board 22 and array 36 of emitters 38 carried by backplane 20. Further, for bi-directional optical data transmission from printed circuit board 22 to backplane 20 as well as from backplane 20 to printed circuit board 22, an array 36 of optical emitters 38 and an optical receiver 40 in that case may be mounted on each of the printed circuit board 22 and backplane 20.

In a converse configuration embodying the invention, a single optical emitter may be employed in conjunction with an array of optical receivers. Such a configuration would be illustrated in FIGS. 1–3 by substituting for element 40 an optical emitter such as a laser diode or an LED, and substituting for element 36 an array of optical receivers, such as photodiodes or other types of photodetectors, for example. Lensing (not shown) may be used to optimize the light path. Whether to employ a single optical receiver and an array of optical emitters, or a single optical emitter and an array of optical receivers is determined by a variety of decision factors, such as component cost and size. As discussed above, an optical device array may be optimized using custom ASIC (application specific integrated circuit) technology with the desired minimum pitch for alignment, with multiplexing circuitry included on the same device, if desired. Again, the relative positions of elements 36 and 40 may be reversed, for either optical data transmission from printed circuit board 22 to backplane 20 or optical data transmission from backplane 20 to printed circuit board 22. Bi-directional optical data transmission in the converse configuration may be accomplished by mounting an array of optical receivers and an optical emitter on each of the printed circuit board 22 and backplane 20.

Figure 5:
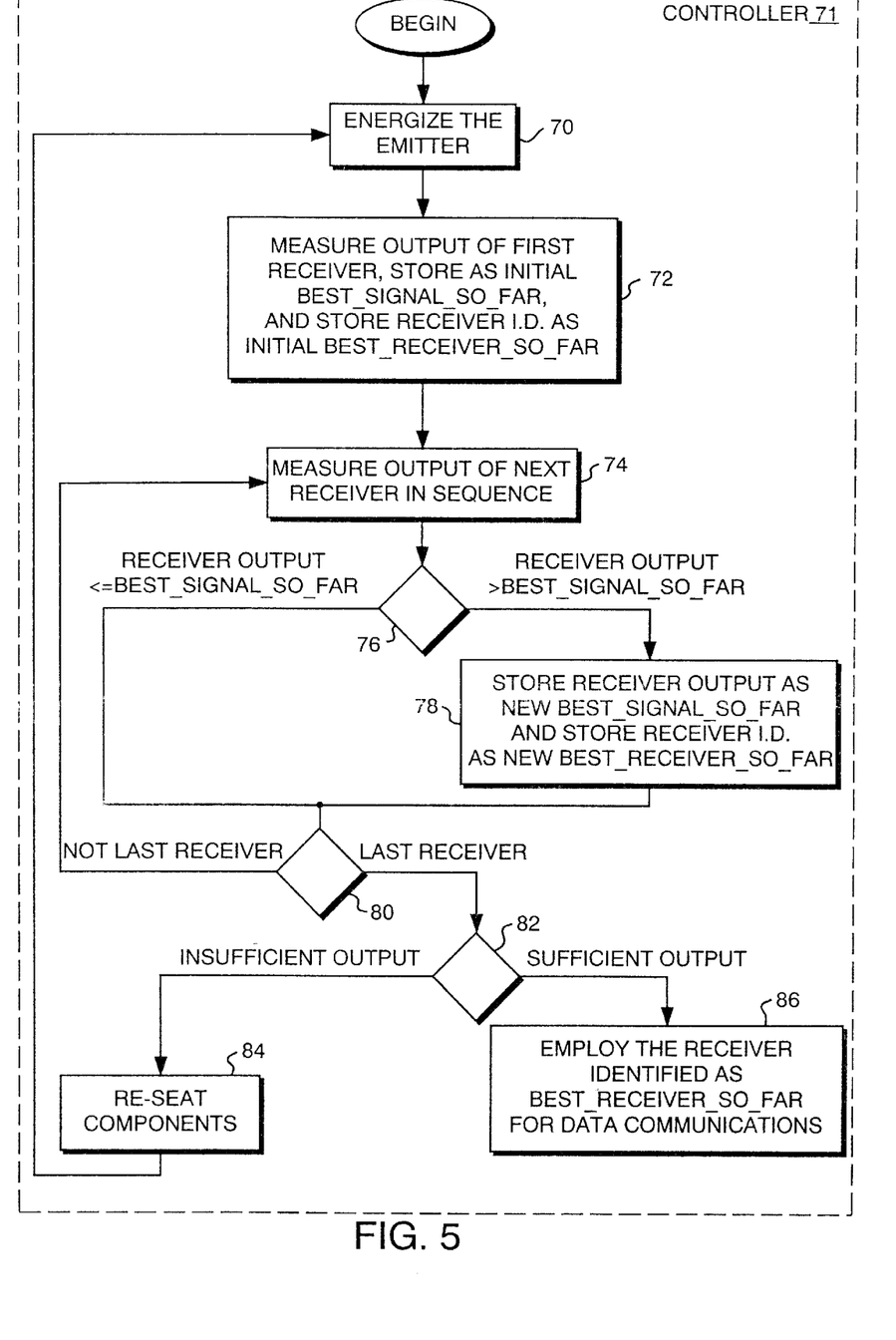
FIG. 5 is a flow chart depicting an alternative method embodying the invention.

FIG. 5 represents steps of an alignment process embodying the invention where the converse configuration of a single optical emitter and an array of optical receivers is employed. In one embodiment, the flowchart of FIG. 5 may be embodied in a controller 71 comprising a computer or microprocessor, for example. The output signals of individual receivers in the array are addressed in a suitable manner, such as by multiplexing. Thus, in box 70 the emitter is energized. In box 72, the output signal of the first receiver in a sequence is measured, and stored to initialize the variable BEST_SIGNAL_SO_FAR, and an identification of the receiver is stored to initialize the variable BEST_RECEIVER_SO_FAR.

Next, a loop is entered beginning with box 74, wherein the output signal of the next receiver in the sequence is measured. In decision box 76, this receiver output signal is compared to the value of the stored variable BEST_SIGNAL_SO_FAR. If the receiver output signal is greater than the value of the variable BEST_SIGNAL_SO_FAR, then in box 78 the receiver output signal is stored as the new value for the variable BEST_SIGNAL_SO_FAR, and the identification of the particular receiver is stored as the new value of the variable BEST_RECEIVER_SO_FAR. Execution then proceeds to decision box 80. If, on the other hand, in decision box 76 it is determined that the current receiver output signal is less than or equal to the value stored in variable BEST_SIGNAL_SO_FAR, then execution proceeds directly to decision box 80.

In decision box 80, it is determined whether the loop is completed. If in decision box 80 it is determined that the last emitter has not been processed, then execution proceeds back to box 74. If, on the other hand, the last receiver output signal has been scanned, decision box 82 next determines whether a suitable optical alignment or "fit" has been achieved. Thus if in decision box 82 it is determined that the magnitude of the receiver output signal stored as the value of the variable BEST_SIGNAL_SO_FAR is insufficient, indicating that satisfactory alignment has not been achieved, then in box 84 relevant components, such as a printed circuit board, are re-seated, and the process begins again with box 70. If in decision box 82 it is determined that satisfactory alignment has been achieved, then in box 86 the particular receiver identified as having the BEST_SIGNAL_SO_FAR is employed for subsequent data communications.

Similarly to what is described above with reference to FIG. 4, the alignment process represented in FIG. 5 may be performed either manually, such as by a technician, or as an electronically-directed automatic alignment process. The alignment process may be performed upon initial assembly, subsequent repairs, or periodically, which may approach a continuous dynamic process, particularly in environments where vibration or other environmental factors are present.

Figure 6:
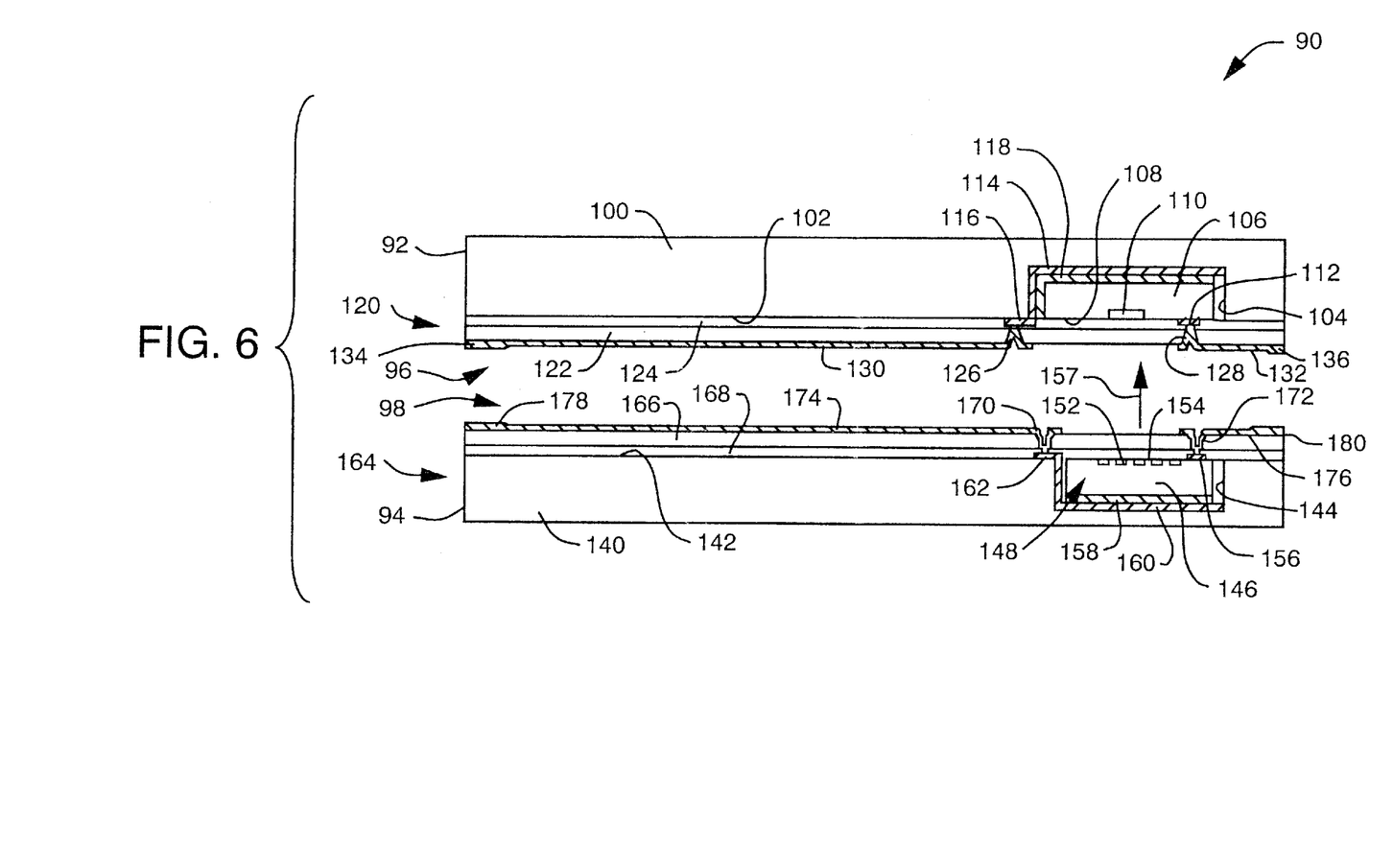
FIG. 6 depicts two modules which may be part of a three-dimensional stack of modules including optical interfaces embodying the invention.

Referring next to FIG. 6, represented in highly schematic form is a three-dimensional stack 90 of modules, comprising representative multi-chip modules (MCMs) 92 and 94. By way of example, each of the MCMs 92 and 94 has been manufactured employing high density interconnect (HDI) fabrication techniques, such as are disclosed in aforementioned Eichelberger et al., U.S. Pat. No. 4,783,695. Alternatively, stack 90 may comprise stacked printed circuit boards (PCBs). Such a stack 90 can be disassembled for repair or reconfiguration as required, and then re-assembled.

Very briefly, in systems employing an high density interconnect (HDI) structure, a ceramic substrate is provided, and individual cavities or wells having appropriate depths at the intended locations of the various chips, are prepared, or one large cavity. Various components are placed in their desired locations within the cavities and adhered to the substrate by means of a thermoplastic adhesive layer. Alternatively the molded substrate technique disclosed in Fillion et al., U.S. Pat. No. 5,353,498 may be employed, or the flexible structure disclosed in Eichelberger et al., U.S. Pat. No. 5,452,182.

A multilayer high density interconnect (HDI) overcoat structure is then built up to electrically interconnect the components. To begin the HDI overcoat structure, a polyimide dielectric film, such as KAPTON® polyimide film (KAPTON is a trademark of DuPont Co.), about 0.0005 and 0.003 inch (12.5 to 75 microns) thick is pretreated to promote adhesion and coated on one side with ULTEM® polyetherimide resin (ULTEM is a trademark of General Electric Co.), or another thermoplastic, and laminated across the tops of the chips, other components and the substrate, with the ULTEM® resin serving as a thermoplastic adhesive to hold the KAPTON® film in plate. Exemplary lamination techniques are disclosed in Eichelberger et al., U.S. Pat. No. 4,933,042.

The actual as-placed locations of the various components and contact pads thereon are typically determined by employing optical imaging techniques. Via holes are adaptively laser drilled in the KAPTON film and ULTEM adhesive layers in alignment with the contact pads on the electronic components in their actual as-placed portions. Exemplary laser drilling techniques are disclosed in Eichelberger et al., U.S. Pat. Nos. 4,714,516 and 4,894,115, and Loughran et al., U.S. Pat. No. 4,764,485.

A metallization layer is deposited over the KAPTON film layer and extends into the via holes to make electrical contact to the contact pads disposed thereunder. This metallization layer may be patterned to form individual conductors during its deposition, or may be deposited as a continuous layer and then patterned using photoresist and etching techniques. The photoresist is preferably exposed under a laser which, under program control, is scanned relative to the substrate to provide an accurately aligned conductor pattern upon completion of the process. Exemplary technique for patterning the metallization layer are disclosed in Wojnarowski et al., U.S. Pat. Nos. 4,780,177 and 4,842,677, and Eichelberger et al., U.S. Pat. No. 4,835,704. Any misposition of the individual electronic components and their contact pads is compensated for by an adaptive laser lithography system as disclosed in aforementioned U.S. Pat. No. 4,835,704.

In the particular embodiment of FIG. 6, only the electronic components comprising electro-optical devices included in modules 92 and 94 for data communications are illustrated, and remaining electronic components included in modules 92 and 94 are omitted for clarity of illustration.

Modules 92 and 94 have respective facing portions 96 and 98, which illustratively are the bottom of module 92 and the top of module 94. The distance between modules 92 and 94 is exaggerated in FIG. 6 for purposes of illustration, and mechanical mounting details are omitted.

Upper module 92 comprises a substrate 100 having a substrate surface 102 and a cavity or well 104 containing an optical receiver 106 in the form of a semiconductor die having an active major surface 108. On active major surface 108 are a receive sense area 110, and a received signal contact pad 112.

Cavity 104 is metallized, and has an electrically conductive metallization layer 114 extending to a contact pad 116 on surface 102 of substrate 100. Receiver die 106 has a metallized back contact 118 in electrical contact with cavity 104 metallization 114, and secured employing solder or an electrically conductive adhesive so as to establish electrical contact.

To provide electrical connections, an HDI overcoat layer 120 includes an optically transparent dielectric film 122 laminated over surface 102 of substrate 100 and active major surface 108 of receiver die 106, and adhered employing an optically transparent thermoplastic adhesive layer 124. Optionally a window (not shown) may be formed in polyimide 122 and adhesive 124 layers over receive sense area 110. Such a window can be formed by laser ablation, with or without a mask. Suitable techniques are disclosed in aforementioned Eichelberger et al., U.S. Pat. No. 4,894,115; Cole et al., U.S. Pat. No. 5,169,678; Komrumpf et al., U.S. Pat. No. 5,157,255; and Wojnarowski et al., U.S. Pat. No. 5,302,547.

Vias 126 and 128 are formed through dielectric film layer 122 and adhesive layers 124 in alignment with well metallization contact pad 116 and with signal contact pad 112, respectively. Conductors 130 and 132 comprising a patterned metallization layer extend from vias 126 and 128 to representative module contact pads 134 and 136, respectively.

In a similar manner, lower module 94 comprises a substrate 140 having a substrate surface 142 and a metallized cavity or well 144 containing an optical transmitter 146 in the form of a semiconductor die having an array 148 of optical emitters 152, such as LEDs or laser diodes at an active major surface 154. On active major surface 154 is a representative electrical contact 156, which serves a control input for controlling activation of individual emitters 152 of array 148. An arrow 157 represents light (not necessarily visible light) from emitter 152 of array 148 directed towards receive sense area 110.

Optical transmitter die 146 includes a metallized back contact 158 secured to and electrically connected to a metallization layer 160 within cavity 144, and extending to a contact pad 162 on substrate 140 surface 142.

For electrical interconnections, an HDI overcoat layer 164 includes an optically transparent dielectric film 166 laminated over substrate 140 surface 142 and active major surface 154, employing an adhesive layer 168. Representative vias 170 and 172 are formed over contact pads 162 and 156, and representative electrical conductors 174 and 176 comprising a patterned metallization layer extend from vias 170 and 172 to representative module contact pads 178 and 180, respectively. Optionally a window (not shown) may be formed in polyimide 166 and adhesive 168 layers over array 148 of emitters 152.

Upon assembly of stack 90, optical emitter array 148 and receive sense area 110 are positioned within a predetermined tolerance of each other to establish an optical data communication path. Array 148 is large enough to accommodate misalignment of array 148 and receive sense area 110 with reference to each other within the predetermined tolerance. The sizes of emitters 152 and receive sense area 110 are preferably optimized.

During the actual alignment process, optical emitter array 148 and receive sense area 110 of FIG. 6 are operated in the same manner as is described hereinabove with reference to FIGS. 1–4 to identify which one of the individual optical emitters 152 provides the optimum data communication path for transmitting signals from lower module 94 to upper module 92. The particular emitter 152 so identified is employed for subsequent data communications.

Although array 148 of optical emitters 152 is shown on lower module 94 and optical receiver 110 is shown on upper module 92 for optical data transmission from lower module 94 to upper module 92, the relative positions can be reversed for optical data transmission from upper module 92 to lower module 94. For bidirectional optical data transmission, an array 148 of optical emitters 152 and an optical receiver 110 can be mounted on each of the modules 92 and 94.

In a converse configuration, rather than having an array 148 of emitters 152 and a single optical receiver 110, a single emitter may be employed in combination with an array of receivers. In such converse configuration, element 110 would comprise an optical emitter, element 148 would comprise an array of optical receivers, and the direction of arrow 156 would be reversed.

Figure 7:
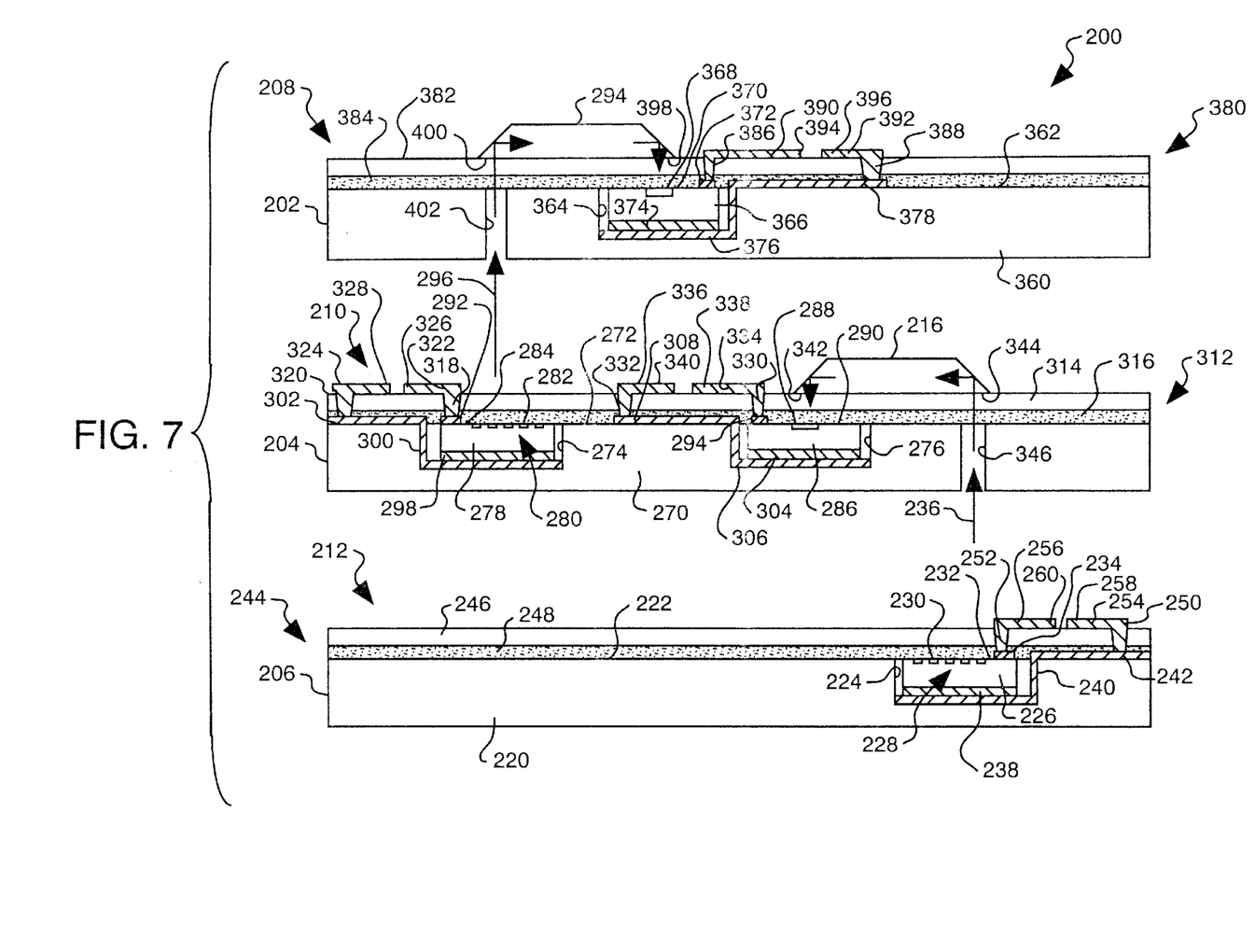
FIG. 7 depicts an alternative three-dimensional stack of modules embodying the invention.

Referring next to FIG. 7, depicted is another three-dimensional stack 200 of MCMs 202, 204 and 206. Alternatively, stack 200 may comprise stacked PCBs or stacked semiconductor wafers. In overview, FIG. 7 illustrates an embodiment in which the electro-optical devices are located on the tops 208, 210 and 212 of the individual modules 202, 204 and 206, facilitated by employing optical waveguides 214 and 216 and, in addition, in which an intermediate module, such as module 204, includes both optical transmit and optical receive elements.

In the module stack 200 of FIG. 7, the lowermost module 206 is comparable to module 94 of FIG. 6. Module 206 comprises a substrate 220 having a substrate surface 222 and a metallized cavity or well 224 containing an optical transmitter 226 in the form of a semiconductor die having array 228 of optical emitters 230, such as LEDs or laser diodes at an active major surface 232. On active major surface 232 is a representative electrical contact 234, which serves a control input for controlling activation of individual emitters 230 of array 228. An arrow 236 represents light (not necessarily visible light) from an emitter 230 of array 238 directed towards intermediate module 204.

Optical transmitter die 226 includes a metallized back contact 238 secured to and electrically connected to a metallization layer 240 within cavity 224, and extending to a contact pad 242 on substrate 220 surface 222.

For electrical interconnections, an HDI overcoat layer 244 includes an optically transparent dielectric film 246 laminated over substrate 220 surface 222 and active major surface 232, employing an adhesive layer 248. Representative vias 250 and 252 are formed over contact pads 242 and 234, and representative electrical conductors 254 and 256 comprising a patterned metallization layer extend from vias 250 and 252 to representative module contact pads 258 and 260, respectively. Optionally a window (not shown) may be formed in polyimide 166 and adhesive 168 layers over array 228 of emitters 230.

In the module stack of 200 of FIG. 7, intermediate module 204 comprises a substrate 270 having a substrate surface 272 and two metallized cavities or wells 274 and 276 respectively containing an optical transmitter 278 in the form of a semiconductor die having an array 280 of optical emitters 282, such as LEDs or laser diodes at an active major surface 284; and an optical receiver 286 in the form of a semiconductor die having a receive sense area 288 on an active major surface 290. On active major surface 284 of transmitter die 278 is a representative electrical contact 292 which serves as a control input for controlling activation of individual emitters 282 of array 280. Also on active major surface 290 of optical receiver die 286 is a received signal contact pad 294. An arrow 296 represents light (not necessarily visible light) from an emitter 282 of array 280 directed towards upper module 202.

Optical transmitter die 278 includes a metallized back contact 298 secured to and electrically connected to a metallization layer 300 within cavity 274, and extending to a contact pad 302 on substrate 270 surface 272. In the same manner, optical receiver die 286 includes a metallized back contact 304 secured to and electrically connected to a metallization layer 306 within cavity 276, and extending to a contact pad 308 on substrate 270 surface 272.

For electrical interconnections, an HDI overcoat layer 312 includes an optically transparent dielectric film 314 laminated over substrate 270 surface 272 and active major surfaces 284 and 290 of die 278 and 286, employing an adhesive layer 316. For electrical connections to transmitter die 278, representative vias 318 and 320 are formed over contact pads 284 and 302, and representative electrical conductors 322 and 324 extend from vias 318 and 320 to representative module contact pads 326 and 328, respectively. For electrical connections to receiver die 286, representative via holes 330 and 332 are formed over contact pads 294 and 308, and representative electrical conductors 334 and 336 comprising part of the same patterned metallization layer as conductors 322 and 324 extend from vias 330 and 332 to representative module contact pads 338 and 340, respectively. Optionally a window (not shown) may be formed in polyimide 314 and adhesive 316 layers at least over array 280 of emitters 282.

To provide a path for laser or LED light represented by arrow 236 from one of the emitters 230 of array 238 of lower module 206 to receive sense area 288 of receiver die 286 of intermediate module 204, waveguide 216 is positioned generally on top 210 of module 204, with an end 342 of waveguide 216 positioned over receive sense area 288 so that optical signals presented to the other end 344 of waveguide 216 are directed to receive sense area 288. An aperture 346 is formed through module 204 substrate 270 and positioned so as to provide an optical path from array 238 to waveguide end 344. To achieve a minimum loss configuration, particularly in view of beam divergence, the beam of laser or LED light represented by arrow 236 may need to be guided along part or all of the optical path. For example, optical fibers (not shown) may be inserted through aperture 346.

Example waveguide materials include glass and sufficiently transparent polymer materials, for example. Methods for making optical waveguides are disclosed in Wojnarowski et al., U.S. Pat. Nos. 5,525,190, 5,562,838 (aforementioned) and 5,737,458 (aforementioned). Laser machining can be employed to form internally reflective bevels on waveguides 214 and 216.

The uppermost module 202 in module stack 200 of FIG. 7 comprises a substrate 360 having a substrate surface 362 and a metallized cavity or well 364 containing an optical receiver 366 in the form of a semiconductor die having a receive sense area 368 on an active major surface 370. Also on active major surface 370 is a representative electrical contact pad 372, which serves as a received signal contact pad 372. Optical receiver die 366 includes a metallized back contact 374 secured to and electrically connected to a metallization layer 376 within cavity 364, and extending to a contact pad 378 on substrate 360 surface 362.

For electrical interconnections, an HDI overcoat layer 380 includes an optically transparent dielectric film 382 laminated over substrate 360 surface 362 and active major surface 370, employing an adhesive layer 384. Representative vias 386 and 388 are formed over contact pads 372 and 378, and representative electrical conductors 390 and 392 comprising a patterned metallization layer extend from vias 386 and 388 to representative module contact pads 394 and 396, respectively.

To provide a path for laser or LED light represented by arrow 296 from one of the emitters 282 of array 280 of intermediate module 204 to receive sense area 368 of receiver die 366 of upper module 202, waveguide 214 is positioned generally on top 208 of module 202, with an end 398 of waveguide 214 positioned over receive sense area 368 so that optical signals presented to the other end 400 of waveguide 214 are directed to receive sense area 368. An aperture 402 is formed through module 202 substrate 360 and positioned so as to provide an optical path from array 280 to waveguide end 400. To achieve a minimum loss configuration, particularly in view of beam divergence, the beam of laser or LED light represented by arrow 296 may need to be guided along part or all of the optical path. For example, optical fibers (not shown) may be inserted through aperture 402.

Although apertures 346 and 402 through substrates 270 and 360 are illustrated, an alternative is to employ transparent substrates 270 and 360, for example made of silicon, quartz or sapphire, in conjunction with light transmission of an appropriate wavelength. For example, silicon is transparent to light at a wavelength of approximately 1000 nm.

Upon assembly of the FIG. 7 module stack 200, optical emitter array 228 of lower module 206 and receive sense area 288 of intermediate module 204 are in general positioned within a predetermined tolerance with reference to each other so as to establish an optical data communication path. More particularly, optical emitter array 228 is positioned with reference to aperture 346 leading to waveguide 216 end 344. Emitter array 228 is large enough to accommodate misalignment within the predetermined tolerance. Likewise, optical emitter array 280 of intermediate module 204 and receive sense area 368 of upper module 202 are in general positioned within a predetermined tolerance with reference to each other so as to establish an optical data communication path. More particularly, optical emitter array 280 is positioned with reference to aperture 402 leading to waveguide 214 end 400. Emitter array 280 is large enough to accommodate misalignment within the predetermined tolerance.

During the actual alignment process, optical emitter array 228 and receive sense area 288 of FIG. 7, as well as optical emitter array 280 and receive sense area 368, are operated in the same manner as is described hereinabove with reference to FIGS. 1–4, to identify which one of the individual optical emitters 230 of array 228 provides the optimum data communication path for transmitting signals from lower module 206 to intermediate module 204, and to identify which one of the individual optical emitters 282 of array 280 provides the optimum data communication path for transmitting signals from intermediate module 204 to upper module 202. The particular emitter 230 and the particular emitter 282 so identified are employed for subsequent data communications.

Figure 8:
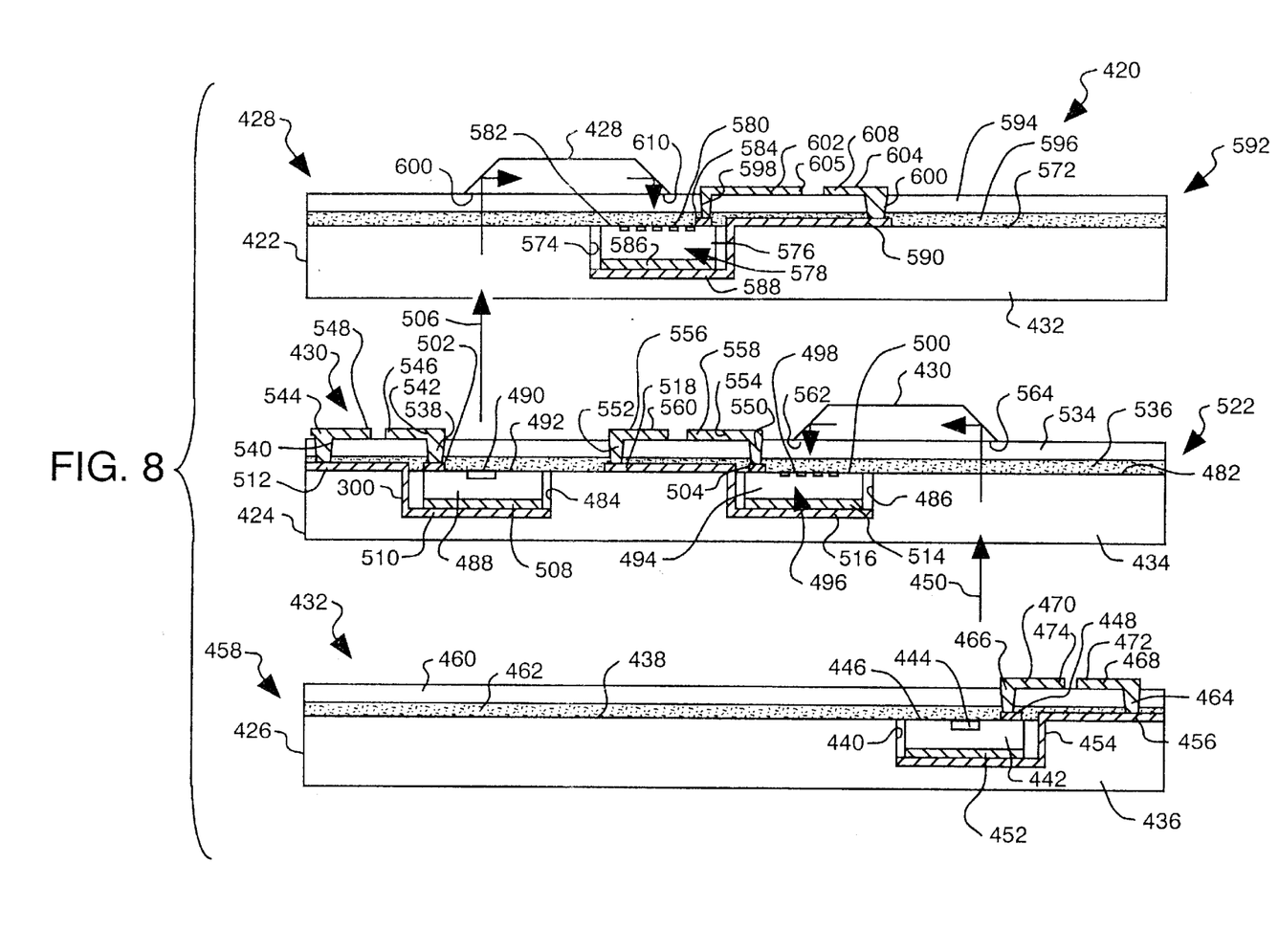
FIG. 8 depicts yet another alternative three-dimensional stack of modules embodying the invention.

FIG. 8 depicts an alternative module stack 420 of MCMs 422, 424 and 426. Module stack 420 of FIG. 8 may be viewed as embodying an optical data configuration which is the converse of the configuration of module stack 200 of FIG. 7, in that the optical receiver elements are organized as arrays, and the optical transmitter elements are single-emitter elements. As in FIG. 7, in FIG. 8 all electro-optical devices are located on the tops 428, 430 and 432 of the individual modules 422, 424 and 426, facilitated by employing optical waveguides 428 and 430. In addition, optically transparent module substrates are employed. Thus modules 422, 424 and 426 comprise respective substrates 432, 434 and 436, and at least substrates 432 and 434 are transparent at the optical wavelengths employed for data communications. Also, an intermediate module, such as module 424, includes both optical transmit and optical receive elements.

In the module stack 420 of FIG. 8, substrate 436 of module 426 has a substrate surface 438 and a metallized cavity or well 440 containing an optical transmitter 442 in the form of a semiconductor die comprising an optical emitter 444, such as an LED or laser diode, at an active major surface 446. Also on active major surface 446 is a representative electrical contact 448, which serves a signal input for activating emitter 444. An arrow 450 represents light (not necessarily visible light) from emitter 444 directed towards intermediate module 424.

Optical transmitter die 442 includes a metallized back contact 452 secured to and electrically connected to a metallization layer 454 within cavity 440, and extending to a contact pad 456 on substrate 436 surface 438.

For electrical interconnections, an HDI overcoat layer 458 including an optically transparent dielectric film 460 laminated over substrate 436 surface 438 and active major surface 446, employing an adhesive layer 462. Representative vias 464 and 466 are formed over contact pads 456 and 448, and representative electrical conductors 468 and 470 comprising a patterned metallization layer extend from vias 464 and 466 to representative module contact pads 472 and 474, respectively. Optionally a window (not shown) may be formed in polyimide 460 and adhesive 462 layers over optical emitter 444.

Optically transparent substrate 434 of intermediate module 424 has a substrate surface 482 and two metallized cavities or wells 484 and 486 respectively containing an optical transmitter 488 in the form of a semiconductor die having an optical emitter 490, such as LEDs or laser diodes at an active major surface 492; and an optical receiver array in the form of a semiconductor die 494 having an array 496 of optical receiver elements 498 on an active major surface 500. On active major surface 492 of transmitter die 488 is a representative electrical contact 502 which serves as a signal input for activating emitter 490. Also on active major surface 500 of optical receiver die 486 is a representative signal contact pad 504 for selection of and reading output signals from individual ones of receiver elements 498 of array 496. An arrow 506 represents light (not necessarily visible light) from emitter 490 directed towards upper module 422.

Optical transmitter die 488 includes a metallized back contact 508 secured to and electrically connected to a metallization layer 510 within cavity 484, and extending to a contact pad 512 on substrate 434 surface 482. In the same manner, optical receiver die 494 includes a metallized back contact 514 secured to and electrically connected to a metallization layer 516 within cavity 486, and extending to a contact pad 518 on substrate 434 surface 482.

For electrical interconnections, an HDI overcoat layer 522 includes an optically transparent dielectric film 534 laminated over substrate 434 surface 482 and active major surfaces 492 and 500 of die 488 and 494, employing an adhesive layer 536. For electrical connections to transmitter die 488, representative vias 538 and 540 are formed over contact pads 502 and 512, and representative electrical conductors 542 and 544 extend from vias 538 and 540 to representative module contact pads 546 and 548, respectively. For electrical connections to receiver die 494, representative vias 550 and 552 are formed over contact pads 504 and 518, and representative electrical conductors 554 and 556 comprising part of the same patterned metallization layer as conductors 542 and 544 extend from vias 542 and 544 to representative module contact pads 558 and 560, respectively. Optionally a window (not shown) may be formed in polyimide 534 and adhesive 536 layers at least over emitter 490.

To provide a path for laser or LED light represented by arrow 450 from emitter 444 on lower module 426 to receiver array 496 on die 494 of intermediate module 424, waveguide 430 is positioned generally on top 430 of module 424, with an end 562 of waveguide 430 positioned over receiver array 496 so that optical signals presented to the other end 564 of waveguide 430 are directed to receiver array 564. Since substrate 434 is optically transparent, light 450 from emitter 444 passes through substrate 434 to waveguide 430 end 564.

The uppermost module 422 in module stack 420 of FIG. 8 has a substrate surface 572 and a metallized cavity or well 574 containing an optical receiver array in the form of a semiconductor die 576 having an array 578 of optical receiver elements 580 on an active major surface 582. Also on active major surface 582 is a representative electrical contact pad 584 for selection of and reading output signals from individual ones of receiver elements 580 of array 578. Optical receiver die 576 includes a metallized back contact 586 secured to and electrically connected to a metallization layer 588 within cavity 574 and extending to a contact pad 590 on substrate 432 surface 572.

For electrical interconnections, an HDI overcoat layer 592 includes an optically transparent dielectric film 592 laminated over substrate 432 surface 572 and active major surface 582, employing an adhesive layer 596. Representative vias 598 and 600 are formed over contact pads 584 and 590, and representative electrical conductors 602 and 604 comprising a patterned metallization layer extend from vias 598 and 600 to representative module contact pads 606 and 608, respectively.

To provide a path for laser or LED light represented by arrow 506 from emitter 490 on intermediate module 204 to receiver array 578 on die 576 of upper module 422, waveguide 428 is positioned generally on top 428 of module 422, with an end 610 of waveguide 214 positioned over receiver array 578 so that optical signals presented to the other end 610 of waveguide 428 are directed to receiver array 578. Since substrate 432 is optically transparent, light 506 from emitter 490 passes through substrate 432 to waveguide 428 end 610.

Upon assembly of the FIG. 8 module stack 420, optical emitter 444 of lower module 426 and receiver array 496 of intermediate module 424 are in general positioned within a predetermined tolerance with reference to each other so as to establish an optical data communication path. More particularly, optical emitter 444 is positioned with reference to substrate 434 and waveguide 430 end 564. Receiver array 496 is large enough to accommodate misalignment within the predetermined tolerance. Likewise, optical emitter 490 of intermediate module 424 and receiver array 578 of upper module 422 are in general positioned within a predetermined tolerance with reference to each other so as to establish an optical data communication path. More particularly, optical emitter 490 is positioned with reference to substrate 432 and waveguide 428 end 610. Receiver array 578 is large enough to accommodate misalignment within the predetermined tolerance.

During the actual alignment process, optical emitter 444 and receiver array 496 of FIG. 8, as well as optical emitter 490 and receiver array 578, are operated in the same manner as is described hereinabove with reference to FIGS. 1–3 and 5, to identify which one of the individual optical receivers 498 of array 496 provides the optimum data communication path for transmitting signals from lower module 426 to intermediate module 424, and to identify which one of the individual optical receivers 580 of array 578 provides the optimum data communication path for transmitting signals from intermediate module 424 to upper module 422. Thus optical emitter 444 is energized and the output signals of the individual receivers of array 496 are measured, and optical emitter 490 is energized and the output signals of the individual receivers of array 578 are measured. The particular receiver 498 and the particular receiver 580 so identified are employed for subsequent data communications.

Figure 9:
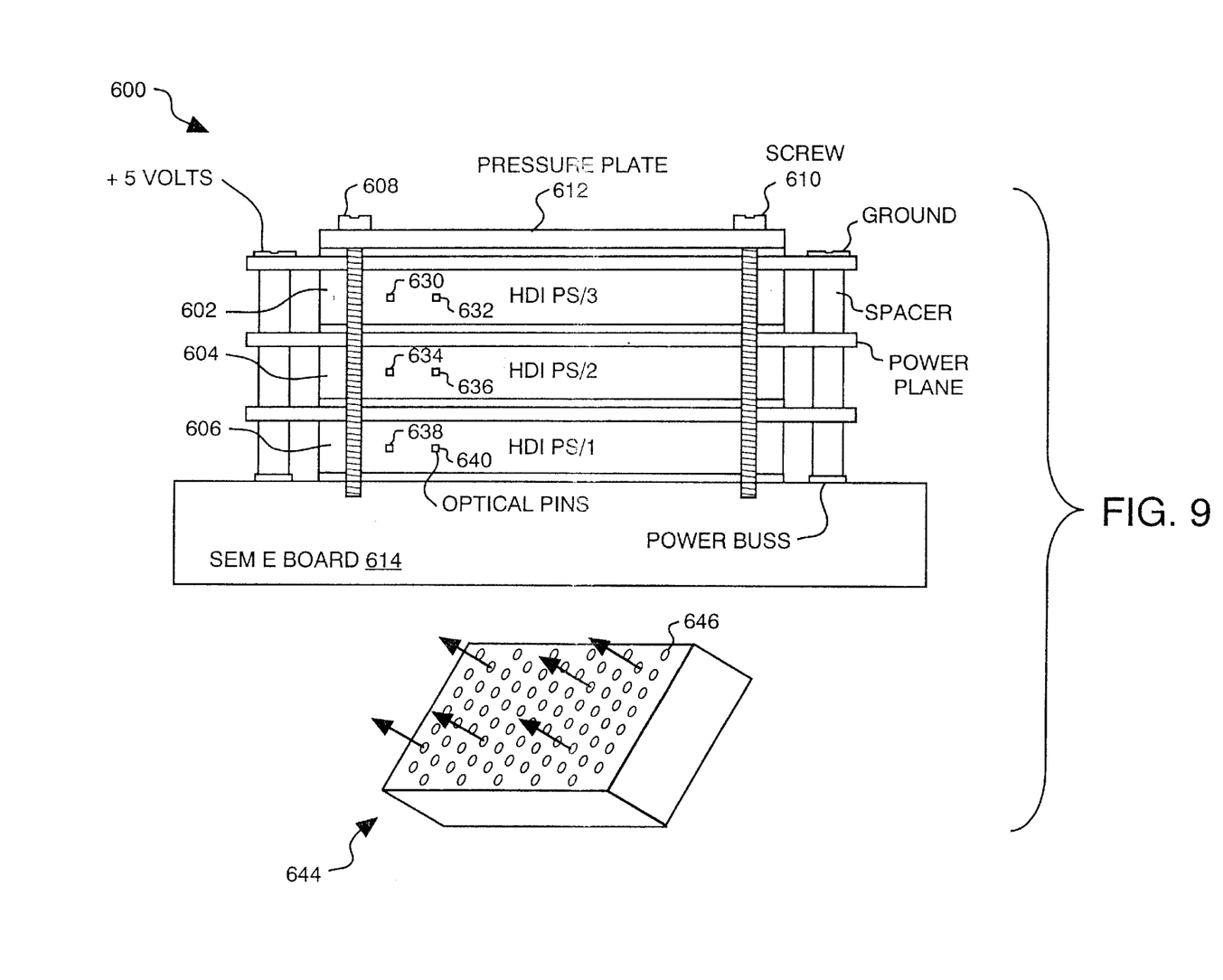
FIG. 9 depicts a three-dimensional stack of modules including optical interconnect ports in the sides of the modules and a corresponding array for data communications embodying the invention.

Referring next to FIG. 9, illustrated is yet another three dimensional stack 600 of MCMs 602, 604 and 606 shown assembled by means of screws 608 and 610 and a pressure plate 612 to a base 614. An example of such a module stack 600 is a stack of PCBs, MCMs or the like, separated by z-axis interposer material which is electrically conductive in only one direction, and pressed together. Stacks of stacks may also be assembled, employing the stack structure of Eichelberger et al., U.S. Pat. No. 5,019,946.

As an embodiment of the invention, modules 602, 604 and 606 have optical receivers 630, 632, 634, 636, 638 and 640 in the sides of the module 602, 604 and 606. These optical receivers 630, 632, 634 636, 638 and 640 may also be viewed as optical pins or ports, and may also comprise the ends of optical fibers or waveguides.

Either individual smaller arrays (not shown) of optical emitters, or a single relatively larger array 644 of optical emitters 646 is positioned within a predetermined tolerance with reference to the optical receiver 632, 634, 636, 638 and 640 for establishing optical data communications path to the module 602, 604 and 606.

During the actual alignment process, optical emitter array 644 and the individual optical receivers 630, 632, 634, 636, 638 and 640 are operated in the same manner as is described hereinabove with reference to FIGS. 1–4 to identify which one of the individual optical emitters 646 of array 644 provides the optimum data communication path for transmitting signals from array 644 to each of the optical receivers 630, 632, 634, 636, 638 and 640. A different one of the individual optical emitters 646 is so identified for optical data communications with each of the optical receivers 630, 632, 634, 636, 638 and 640.

Figure 10:
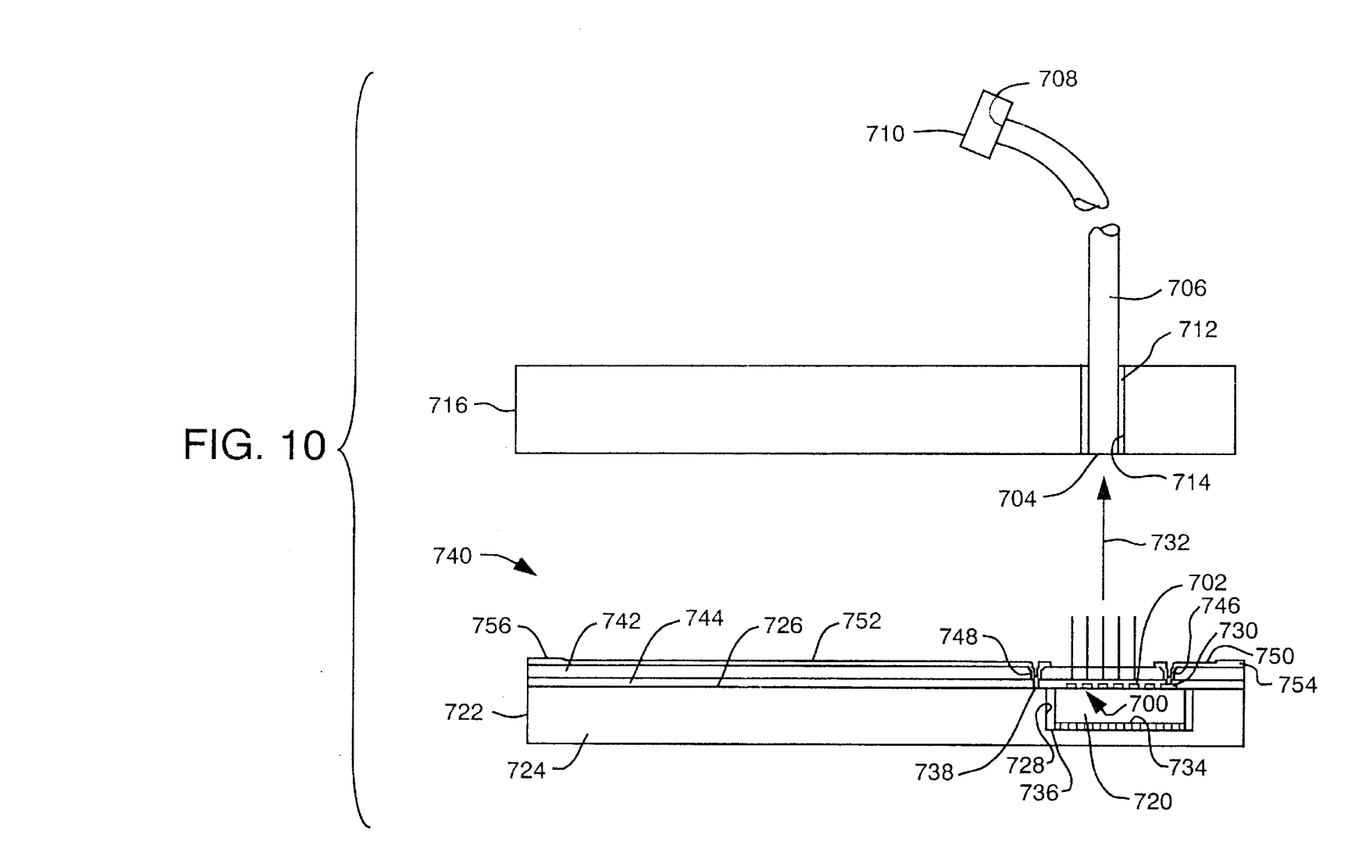
FIG. 10 depicts an embodiment of the invention wherein an optical connection is aligned to an end of an optical fiber.

FIG. 10 depicts an embodiment wherein an array 700 of optical emitters 702, such as LEDs or laser diodes, and an end 704 of an optical fiber 706 are aligned with reference to each other. At the other end 708 of optical fiber 706 is an optical signal receiver 710. Receiver 710 can comprise a semiconductor die, or a camera, for example.

In FIG. 10, end 704 of optical fiber 706 is retained such as by adhesive 712 within an aperture 714 in a substrate holder 716.

Array 700 of optical emitters 702 comprises a semiconductor die 720 included in a module 722 comprising a substrate 724 having a substrate surface 726 and a metallized cavity or well 728 containing optical transmitter 720. Array 700 of optical emitters 702 is at an active major surface 728 of die 720. On active major surface 728 is a representative electrical contact 730, which serves a control input for controlling activation of individual emitters 702 of array 700. An arrow 732 represents light (not necessarily visible light) from an emitter 702 of array 700 directed towards optical fiber 706 end 704. Lenses may be employed in the optical path to capture light directed into waveguide end 704.

Optical transmitter die 720 includes a metallized back contact 734 secured to and electrically connected to a metallization layer 736 within cavity 728, and extending to a contact pad 738 on substrate 724 surface 726.

For electrical interconnections, an HDI overcoat layer 740 includes an optically transparent dielectric film 742 laminated over substrate 724 surface 726 and active major surface 738, employing an adhesive layer 744. Representative vias 746 and 748 are formed over contact pads 730 and 738, and representative electrical conductors 750 and 752 comprising a patterned metallization layer extend from vias 746 and 748 to representative module contact pads 754 and 756, respectively. Optionally a window (not shown) may be formed and polyimide 742 and adhesive 744 layers over array 700 of emitters 702.

For alignment purposes, optical emitters 702 are individually energized in a sequence, while the output signal at the other end 708 of optical fiber 706 is monitored by receiver 710, to determine which emitter 702 in the array 700 of emitters achieves the best optical alignment. Thereafter, for subsequent data communications the particular one of the optical emitters 702 determined to achieve the best alignment is employed.

Although a single optical fiber 706 is illustrated in FIG. 10, the invention is applicable as well as to a multiple fiber situation. In such an embodiment, optical emitter array 700 and the individual optical fibers are operated in essentially the same manner to identify which one of the individual optical emitters 702 of array 700 achieves the best alignment with each of the optical fibers. A different one of the individual optical emitters 702 is so identified for optical data communication via each of the individual optical fibers. The invention is thus employed in end-finding apparatus for fiber optic cables.

In a converse configuration, an array of optical receivers may be employed in conjunction with an optical fiber. Such a configuration would be illustrated in FIG. 10 by reversing the direction of arrow 732 to indicate light coming from end 704 of optical fiber 706, and substituting for array 700 an array of optical receivers, such as photodiodes. For actual alignment of the converse configuration, optical fiber 706 and array 700 (of receivers) are operated by measuring the output signals of the individual receives of the array, to determine which one of the receivers provides the optimum optical path from optical fiber 706 end 704.

Likewise, in FIG. 10 optical receiver 710 may comprise an array of optical receivers, an identified one of which provides an optimum optical path from end 708 of optical fiber 706. Thus, the embodiment of FIG. 10 may be extended to a bundle of individual optical fibers with an array of optical transmitter elements at one end and an array of optical receiver elements at the other end. For each of the individual optical fibers, a particular one of the array of optical transmitter elements and a particular one of the array of optical receiver elements are identified which achieve the best alignment and accordingly the optimum optical path.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for aligning an optical emitter and an optical receiver for data communications, the method comprising:
    providing an array of optical emitters;
    positioning the array of optical emitters and the optical receiver with reference to each other to establish an optical data communication path;
    individually energizing the optical emitters, while monitoring an output signal of the optical receiver, to determine which emitter in the array of optical emitters achieves the best alignment; and
    for subsequent data communications, employing the optical emitter determined to achieve the best alignment.

2. The method of claim 1, wherein individually energizing the optical emitters includes manually energizing the optical emitters.

3. The method of claim 1, wherein individually energizing the optical emitters includes automatically energizing the optical emitters.

4. The method of claim 3, further including periodically individually re-energizing the optical emitters, while monitoring the output signal of the optical receiver, to determine which emitter in the array of optical emitters achieves the best alignment.

5. The method of claim 1, wherein one of the optical receiver and the array of optical emitters is mounted on a plug-in circuit module and the other of the optical receiver and the array of optical emitters is mounted on a backplane, and
    wherein positioning the array of optical emitters and the optical receiver includes inserting the plug-in circuit module in the backplane.

6. The method of claim 1, wherein the optical receiver and the array of optical emitters are mounted on respective modules, and
    wherein positioning the array of optical emitters and the optical receiver includes stacking the respective modules.

7. The method of claim 1, which further comprises:
    providing an optical waveguide having one end optically connected to the optical receiver such that optical signals presented to the other end of the optical waveguide are directed to the optical receiver, and
    wherein positioning the array of optical emitters and the optical receiver with reference to each other comprises positioning the array of optical emitters and the other end of the optical waveguide with reference to each other to establish the optical data communication path.

8. A method for aligning an optical emitter and an end of at least one optical fiber for data communications, the method comprising:
    providing an array of optical emitters;
    positioning the array of optical emitters and the end of the at least one optical fiber with reference to each other to establish an optical data communications path;
    individually energizing the optical emitters, while monitoring an output signal at the other end of the at least one optical fiber, to determine which emitter in the array of optical emitters achieves the best alignment; and
    for subsequent data communications, employing the optical emitter determined to achieve the best alignment.

9. An optical coupling system for data communications, comprising:
    an optical receiver;
    an array of optical emitters positioned within a predetermined tolerance with reference to the optical receiver for establishing an optical data communication path, one of the optical emitters providing the most optimum optical path to the optical receiver; and
    a controller for determining which emitter in the array of optical emitters achieves the best alignment, and causing the optical coupling system to employ the optical emitter determined to achieve the best alignment.

10. The optical coupling system of claim 9, wherein one of the optical receiver and the array of optical emitters is mounted on a plug-in circuit module and the other of the optical receiver and the array of optical emitters is mounted on a backplane which receives the circuit module.

11. The optical coupling system of claim 9, wherein the optical receiver and the array of optical emitters are mounted on respective modules assembled into a stack of modules.

12. The optical coupling system of claim 11, wherein the optical receiver and the array of optical emitters are located on facing portions of the respective modules.

13. The optical coupling system of claim 11, wherein the respective modules each have a top and a bottom and the modulesare stacked such that the bottom of one module faces the top of the next lower module, and the array of optical emitters is located on the top of the next lower module and the optical receiver is located on the top of the one module,
    and further including:
    an optical waveguide on the top of the one module having one end optically connected to the optical receiver such that optical signals presented to the other end of the optical waveguide are directed to the optical receiver; and an optical path through the one module from the bottom to the top for transmitting optical signals from the array of optical emitters to the other end of the optical waveguide.

14. The optical coupling system of claim 13, wherein the one module comprises a transparent substrate supporting the optical path through the one module.

15. The optical coupling system of claim 13, wherein the optical path through the one module comprises an aperture.

16. The optical coupling system of claim 11, which comprises an intermediate module having an optical receiver for receiving optical signals from an array of optical emitters on a module on one side of the intermediate module, and another array of optical emitters for directing optical signals to another optical receiver on a module on the other side of the intermediate module.

17. The optical coupling system of claim 16, further including a controller for determining which receiver in the array of optical receivers achieves the best alignment, and causing the optical coupling system to employ the optical receiver determined to achieve the best alignment.

18. The optical coupling system of claim 9, wherein the array of optical emitters comprises an application specific integrated circuit chip.

* * * * *